United States Patent
Khanuja et al.

(10) Patent No.: US 7,609,550 B2
(45) Date of Patent: Oct. 27, 2009

(54) COMPACT VIRTUAL GROUND DIFFUSION PROGRAMMABLE ROM ARRAY ARCHITECTURE, SYSTEM AND METHOD

(75) Inventors: Amit Khanuja, New Delhi (IN); Deepak Sabharwal, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 12/099,640

(22) Filed: Apr. 8, 2008

(65) Prior Publication Data

US 2008/0212355 A1 Sep. 4, 2008

Related U.S. Application Data

(63) Continuation of application No. 11/385,269, filed on Mar. 21, 2006, now Pat. No. 7,376,013.

(51) Int. Cl.
*G11C 11/34* (2006.01)

(52) U.S. Cl. .................... 365/185.05; 365/63

(58) Field of Classification Search ............ 365/185.05, 365/63
See application file for complete search history.

(56) References Cited

U.S. PATENT DOCUMENTS

| | | | | |
|---|---|---|---|---|
| 5,321,288 A | * | 6/1994 | Gill et al. | 365/185.06 |
| 5,579,260 A | * | 11/1996 | Iwahashi | 365/185.24 |
| 7,529,136 B2 | * | 5/2009 | Micheloni et al. | 365/185.24 |

* cited by examiner

*Primary Examiner*—Tuan T. Nguyen
(74) *Attorney, Agent, or Firm*—The Danamraj Law Group, P.C.

(57) ABSTRACT

A compact, shared source line and bit line architecture for a diffusion programmable ROM. In one embodiment, a ROM circuit or instance includes a plurality of storage cells organized as an array of rows columns. A shared source line is associated with a first pair of adjacent columns, the shared source line being maintained at a predetermined level, wherein source terminals of storage cells in the adjacent columns are electrically coupled to the shared source line. A shared bit line is associated with a second pair of adjacent columns, the shared bit line being maintained at the predetermined level, wherein drain terminals of storage cells in the adjacent columns are electrically coupled to the shared bit line.

11 Claims, 5 Drawing Sheets

---

Providing a diffusion area between the source and drain diffusion islands (i.e., terminals) of each predetermined ROM storage cell for programming a first logic value thereat — 402

For programming a second logic value in predetermined ROM storage cell locations, witholding the diffusion area between the source and drain diffusion islands of the cells (that is, there is no duffusion coupling the source/drain diffusion islands of the cell) — 404

With respect to the ROM storage cells having the second logic value, providing a compensatory diffusion area (i.e., diffusion extension) that electrically couples two adjacent source diffusion islands (sharing a common source line), two adjacent drain diffusion islands (sharing a common bit line), or both, at cells that store the second logic value next to each other on the same column (i.e., one cell is above or below the second cell on the same column) — 406

```
┌─────────────────────────────────────────────────────────────────────────┐
│ Providing a diffusion area between the source and drain diffusion       │
│ islands (i.e., terminals) of each predetermined ROM storage cell for    │
│ programming a first logic value thereat                                 │
└─────────────────────────────────────────────────────────────────────────┘
                                                                  ╲─402
                                    ▼
┌─────────────────────────────────────────────────────────────────────────┐
│ For programming a second logic value in predetermined ROM storage cell  │
│ locations, witholding the diffusion area between the source and drain   │
│ diffusion islands of the cells (that is, there is no duffusion coupling │
│ the source/drain diffusion islands of the cell)                         │
└─────────────────────────────────────────────────────────────────────────┘
                                                                  ╲─404
                                    ▼
┌─────────────────────────────────────────────────────────────────────────┐
│ With respect to the ROM storage cells having the second logic value,    │
│ providing a compensatory diffusion area (i.e., diffusion extension)     │
│ that electrically couples two adjacent source diffusion islands         │
│ (sharing a common source line), two adjacent drain diffusion islands    │
│ (sharing a common bit line), or both, at cells that store the second    │
│ logic value next to each other on the same column (i.e., one cell is    │
│ above or below the second cell on the same column)                      │
└─────────────────────────────────────────────────────────────────────────┘
                                                                  ╲─406
```

COMPACT VIRTUAL GROUND DIFFUSION PROGRAMMABLE ROM ARRAY ARCHITECTURE, SYSTEM AND METHOD

CLAIM OF PRIORITY AND RELATED APPLICATIONS

This nonprovisional application is a continuation application claiming the benefit of the following prior United States patent application entitled: "COMPACT VIRTUAL GROUND DIFFUSION PROGRAMMABLE ROM ARRAY ARCHITECTURE, SYSTEM AND METHOD," filed Mar. 21, 2006, application Ser. No. 11/385,269, which claims priority based upon the following prior United States provisional patent application entitled: "SYSTEM AND METHOD FOR CREATING COMPACT VIRTUAL GROUND DIFFUSION PROGRAMMABLE ROM ARRAY," Application No.: 60/721,822, filed Sep. 29, 2005. Each of the foregoing applications is hereby incorporated by reference.

BACKGROUND OF THE INVENTION

1. Technical Field of the Invention

The present invention relates generally to semiconductor memories. More particularly, and not by way of any limitation, the present invention is directed to a compact virtual ground diffusion programmable architecture as well as associated system, method and circuitry for read-only memory (ROM).

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory, including ROM, is a key technology driver for SOC design. It is also well known that leakage and power consumption are two major factors in designing a high performance ROM core, especially where the device geometries continue to shrink. A traditional ROM cell comprises a single transistor, where the gate is connected to the word line, the drain is connected to the bit line and the source is connected to the ground. In a diffusion programmable ROM, the cell is programmed to store a logic 0 or 1 using the diffusion layer. One logic level is created by the presence of a transistor. On the other hand, the transistor is omitted to create the other logic level.

Diffusion programmable ROMs have been found to be useful because of their relative cell size advantage. However, in the traditional ROM architectures where the source terminals of the ROM cells are connected to ground, power consumption can be unacceptably high due to subthreshold leakage (i.e., static leakage) as well as functional leakage during access operations, especially in high density designs. In order to address this issue, separate source lines that are maintained at a precharged level have been implemented on a per-column basis in certain ROM designs. With respect to accessing such a ROM circuit for read operations, a particular source line is pulled low in order to create a virtual ground. Thereafter, the ROM cell can be read as a traditional ROM cell. Although this design is advantageous in reducing the leakage, the addition of source lines makes the cell size larger than the traditional ROM cell.

SUMMARY OF THE INVENTION

The embodiments of the present patent disclosure are directed to a compact, shared source line and bit line architecture for a diffusion programmable ROM. In one aspect, an embodiment of a ROM circuit or instance includes a plurality of storage cells organized as an array of rows and columns. A shared source line is associated with a first pair of adjacent columns, the shared source line being maintained at a first predetermined level, wherein source terminals of storage cells in the adjacent columns of the first pair are electrically coupled to the shared source line. A shared bit line is associated with a second pair of adjacent columns, the shared bit line being maintained at a second predetermined level, wherein drain terminals of storage cells in the adjacent columns of the second pair are electrically coupled to the shared bit line.

In another aspect, an embodiment is directed to a memory compiler for compiling at least one ROM instance having a shared source line and shared bit line architecture. The memory compiler includes one or more of the following: a code portion for providing a plurality of ROM storage cells organized as an array of rows and columns; a code portion for providing a shared source line associated with a first pair of adjacent columns, the shared source line being maintained at a first predetermined level, wherein source terminals of storage cells in the adjacent columns of the first pair are electrically coupled to the shared source line; and a code portion for providing a shared bit line associated with a second pair of adjacent columns, the shared bit line being maintained at a second predetermined level, wherein drain terminals of storage cells in the adjacent columns of the second pair are electrically coupled to the shared bit line.

In a still further aspect, a method of programming a ROM circuit is disclosed wherein the ROM circuit includes a plurality of storage cells organized as an array of rows and columns. The claimed method comprises one or more of the following: for a first subset of storage cells, providing a diffusion area between source and drain terminals of each predetermined storage cell of the first subset for programming a first logic value thereat; for a second subset of storage cells, withholding the diffusion area between source and drain terminals of each predetermined storage cell of the second subset for programming a second logic value thereat; and providing at least one of a source diffusion extension and a drain diffusion extension for the source and drain terminals, respectively, of a particular storage cell of the second subset that is disposed on a particular column, if the particular storage cell having the second logic value is located next to another storage cell on the particular column having the second logic value.

In general operation, accordingly, a ROM storage cell of the present architecture may be programmed with a first logic value (i.e., a binary 0) by providing a diffusion area between the cell's source and drain terminals (i.e., by forming the transistor devices at the storage cell location). Since there is diffusion between the source and drain terminals where the first logic value is programmed, the source and drain terminals (i.e., diffusion islands) of such cells may be reduced in size and still meet overall minimum design rules. Where programming with a second logic value (i.e., a binary 1) is desired, the source and drain terminals associated with that storage location are not electrically coupled using the diffusion area. In other words, it may be deemed that there is no "cell formation" at the location where a binary 1 is programmed. Because there is no diffusion placed between the source and drain terminals of such "cells," additional diffusion extensions are provided under special circumstances as will be described in greater detail below in order to satisfy the minimum design rules while maintaining the reduced sizing of the source/drain diffusion islands.

BRIEF DESCRIPTION OF THE DRAWINGS

A more complete understanding of the present invention may be had by reference to the following Detailed Description when taken in conjunction with the accompanying drawings wherein:

FIGS. 3 and 4 depict flowcharts of a design and programming methodology of the shared source line and bit line architecture in accordance with one embodiment of the present invention.

DETAILED DESCRIPTION OF THE DRAWINGS

Figure 1:
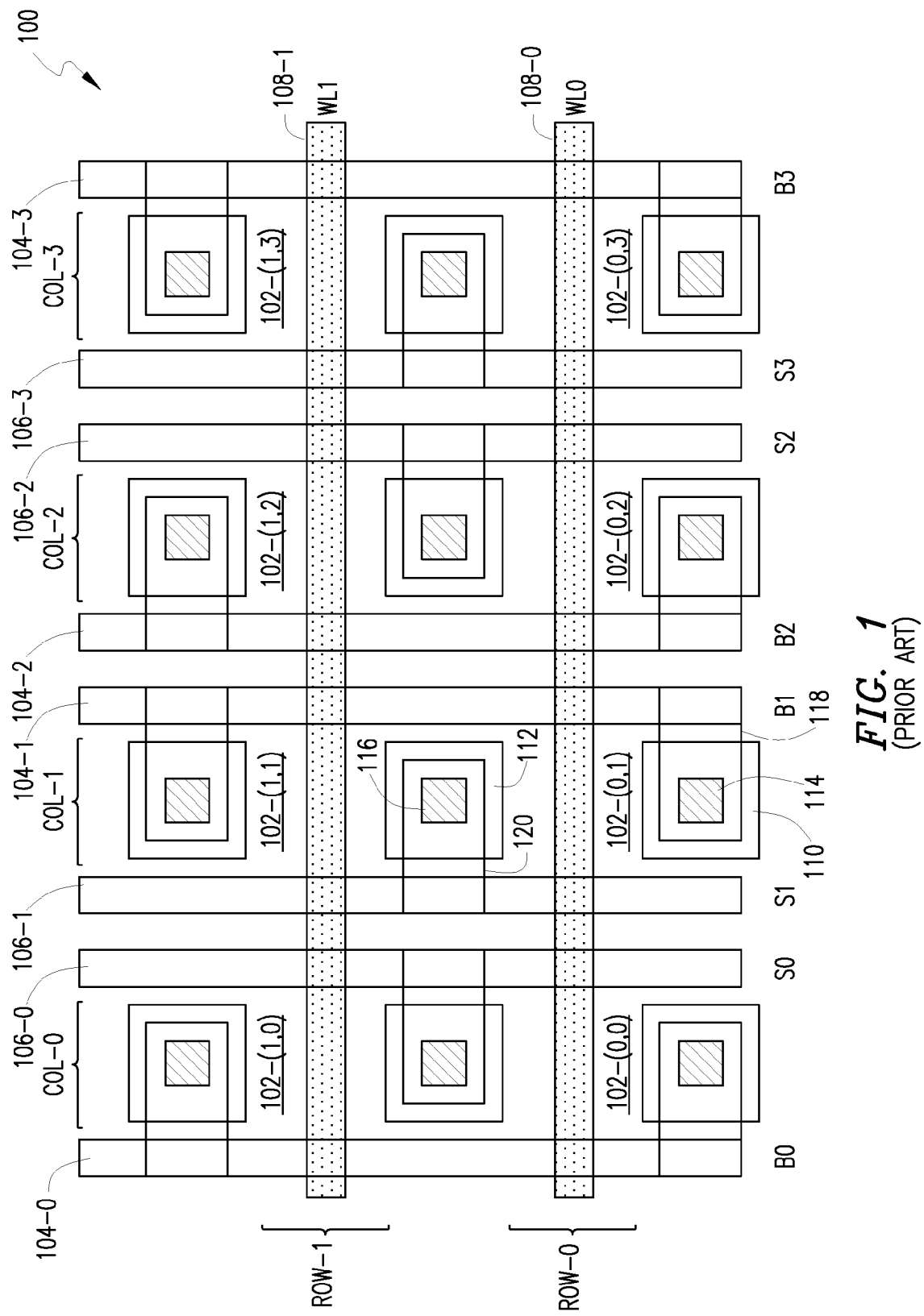
FIG. 1 (Prior Art) depicts a conventional diffusion programmable ROM array.

In the drawings, like or similar elements are designated with identical reference numerals throughout the several views thereof, and the various elements depicted are not necessarily drawn to scale. Referring now to FIG. 1, depicted therein is a layout of a conventional diffusion programmable ROM array 100. As is well known in the memory design art, the layout shown in FIG. 1 is representative of a corresponding ROM array circuit and, accordingly, the layout and the corresponding array are treated as equivalent to ROM circuitry for purposes of the present patent disclosure. As is also well known, a plurality of ROM cells or storage locations may be organized into an array of a predetermined number of rows and columns. By way of illustration, ROM array 100 is provided as a 2-by-4 array (i.e., two rows labeled as ROW-0 and ROW-1 and four columns labeled as COL-0 through COL-3) of eight cells generally at 102-(0,0) through 102-(1,3). A plurality of bit lines, B0 104-0 through B1 104-3 and a plurality of source lines, S0 106-0 through S3 106-3 are disposed in Y-direction, wherein each column of cells is associated with a bit line and a source line that are maintained at a predetermined level (e.g., precharged to VDD).

Each cell or storage location in the ROM array 100 includes a source terminal and a drain terminal, wherein wordlines WL0 108-0 and WL1 108-1 disposed in X-direction are operable as the gates of a row of cells. With respect to each column, the drains of the cells forming the column are electrically coupled to the bit line associated therewith. Likewise, the sources of the cells of the column are also electrically coupled to the source line associated therewith. Referring to the cell 102-(0,1) of COL-1 as an example, reference numerals 110 and 112 refer to the drain and source diffusion islands (i.e., terminals) thereof, wherein a contact 114 is electrically coupled to the drain diffusion island 110 and a contact 116 is electrically coupled to the source diffusion island 112. Conductive extensions 118, 120 respectively couple the drain and source terminals 110, 112 to S1 106-1 and B1 104-1 associated with COL-1.

Programming is effectuated depending on placing diffusion areas ("programming diffusion") between the source and drain terminals of cells that store a particular logic value, e.g., a binary 0. Analogously, where a complementary logic value is to be programmed at certain storage locations, the diffusion areas are not placed between the source and drain terminals thereat. With respect to accessing a cell for a read operation, a particular WL may be selected based on row address decoding and is driven high. Based on column address decoding, a source line is pulled low, thereby operating as a virtual ground during the access operation. If the programming diffusion was provided at the selected cell (i.e., a functional transistor device was formed thereat), the high voltage on the gate turns the device on whereby the associated bit line is driven low, which may be sensed as a first logic value. On the other hand, if there was no programming diffusion at the selected location (i.e., no functional transistor device formed), the bit line would remain high, which may be sensed as a second logic value.

It should be appreciated that in the virtual ground array (VGA) ROM arrangement described above, source lines are not permanently maintained at ground, thereby reducing subthreshold leakage in the array. However, the size of the source and drain diffusion islands needs to be increased so as to satisfy the minimum design rules, especially at the locations having no programming diffusion. In other words, depending on the programming pattern, the VGA arrangement in a diffusion programmable ROM may impose an unacceptable trade-off between reduction in leakage and suboptimal area utilization (i.e., increased cell size).

Figure 2A:
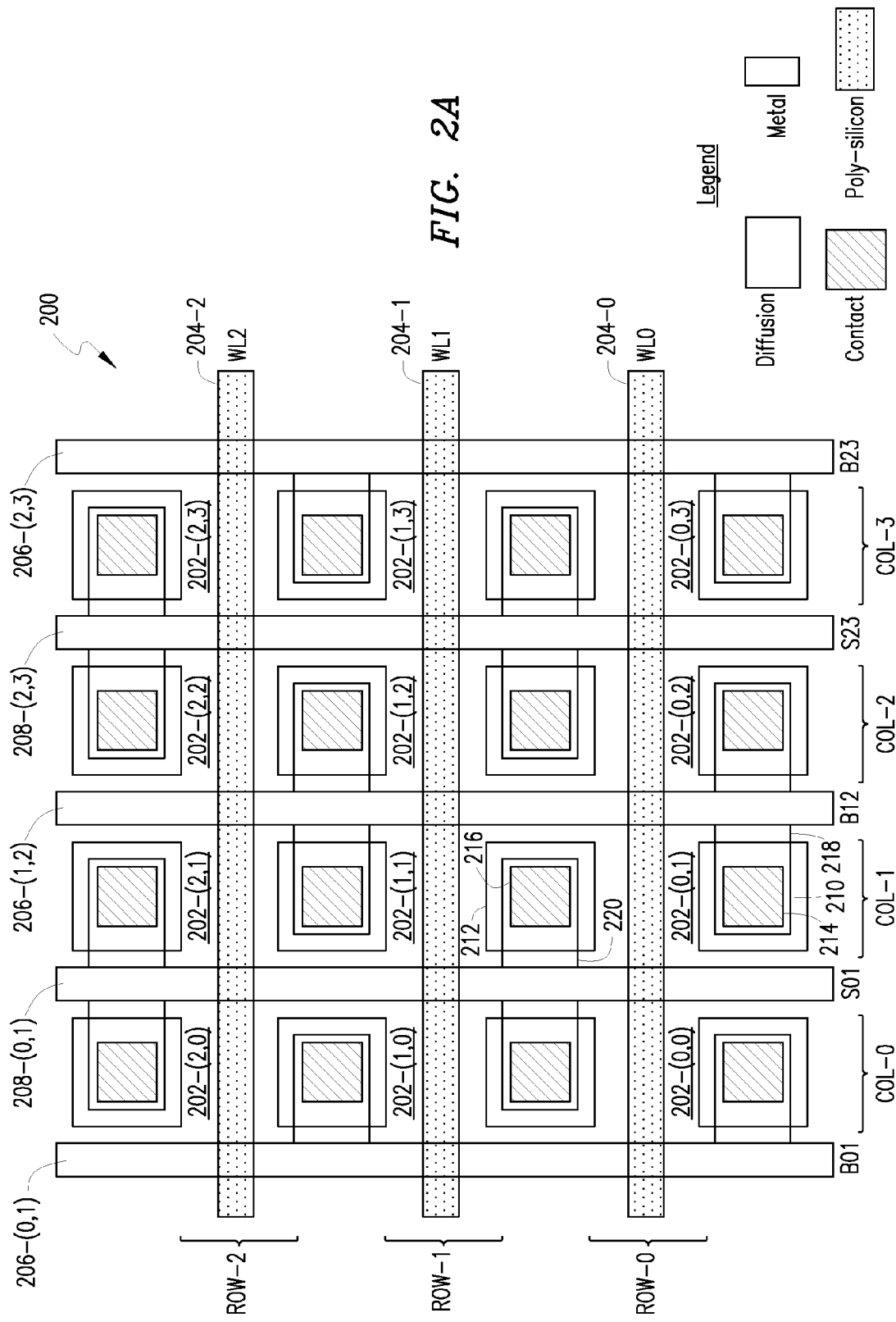
FIG. 2A depicts an exemplary un-programmed ROM array with shared source line and bit line architecture according to one embodiment of the present invention.

FIG. 2A depicts a layout or floor plan of an exemplary un-programmed ROM array circuit 200 having a shared source line and bit line architecture according to one embodiment of the present invention for ameliorating the trade-off between minimum area requirements and reduction in leakage power. By way of illustration, a 3-by-4 array (i.e., three rows, ROW-0 through ROW-2, and four columns, COL-0 through COL-3) is comprised of 12 ROM storage cell locations, generally at 202-(0,0) through 202-(2,3). In this architecture, source lines and bit lines are shared between two adjacent columns, thereby reducing the total number of dedicated bit lines and source lines in half, wherein the shared source lines and shared bit lines are alternately disposed in the array. In other words, if two adjacent columns share a source line between them, they do not share the bit lines. Rather, they each have a separate bit line which they share with their respective adjacent columns. Likewise, if two adjacent columns share a bit line between them, they do not share the source lines. In general, if N columns are disposed in an array, the number of shared source and bit lines will be N/2 and (N/2)+1, respectively. It should be apparent that in one exemplary layout embodiment, the bit lines of the edge columns of the array are not shared, and the total bit line count is therefore (N/2)+1 rather than just N/2. Where the source and bit lines may be swapped in layout due to, e.g., polarity reversal of the storage devices, the number of shared source and bit lines will be (N/2)+1 and N/2, respectively, instead.

As illustrated in FIG. 2A, a shared source line is associated with each pair of adjacent columns of cells, wherein the source terminals of the storage cells are electrically coupled to the shared source line disposed between the adjacent columns. Source line S01 208-(0,1) is shared between COL-0 and COL-1. Likewise, source line S23 208-(2,3) is shared between COL-2 and COL-3. A total of three bit lines are provided for the 3-by-4 array 200, wherein the first (B01) and the last bit line (B23) are associated with COL-0 and COL-3, respectively. Since B01 206-(0,1) and B23 206-(2,3) form the edges of the array 200, they are not shared with other columns. On the other hand, the bit line B12 206-(1,2) is shared between COL-1 and COL-2, to which the drain terminals of the storage cells disposed on these two columns are electrically coupled. As before, wordlines WL0 204-0, WL1 204-1, and WL2 204-2 disposed in X-direction are operable as the gates of a row of storage cells.

Referring to the cell location 202-(0,1) of COL-1 as an example, reference numerals 210 and 212 refer to the drain and source diffusion islands (i.e., terminals) thereof, wherein a contact 214 is electrically coupled to the drain diffusion island 210 and a contact 216 is electrically coupled to the source diffusion island 212. Conductive extensions (e.g., formed of metal) 218, 220 respectively couple the drain and source terminals 210, 212 to B12 206-(1,2) that is shared between COL-1 and COL-2 and to S01 208-(0,1) that is shared between COL-0 and COL-1.

Figure 2B:
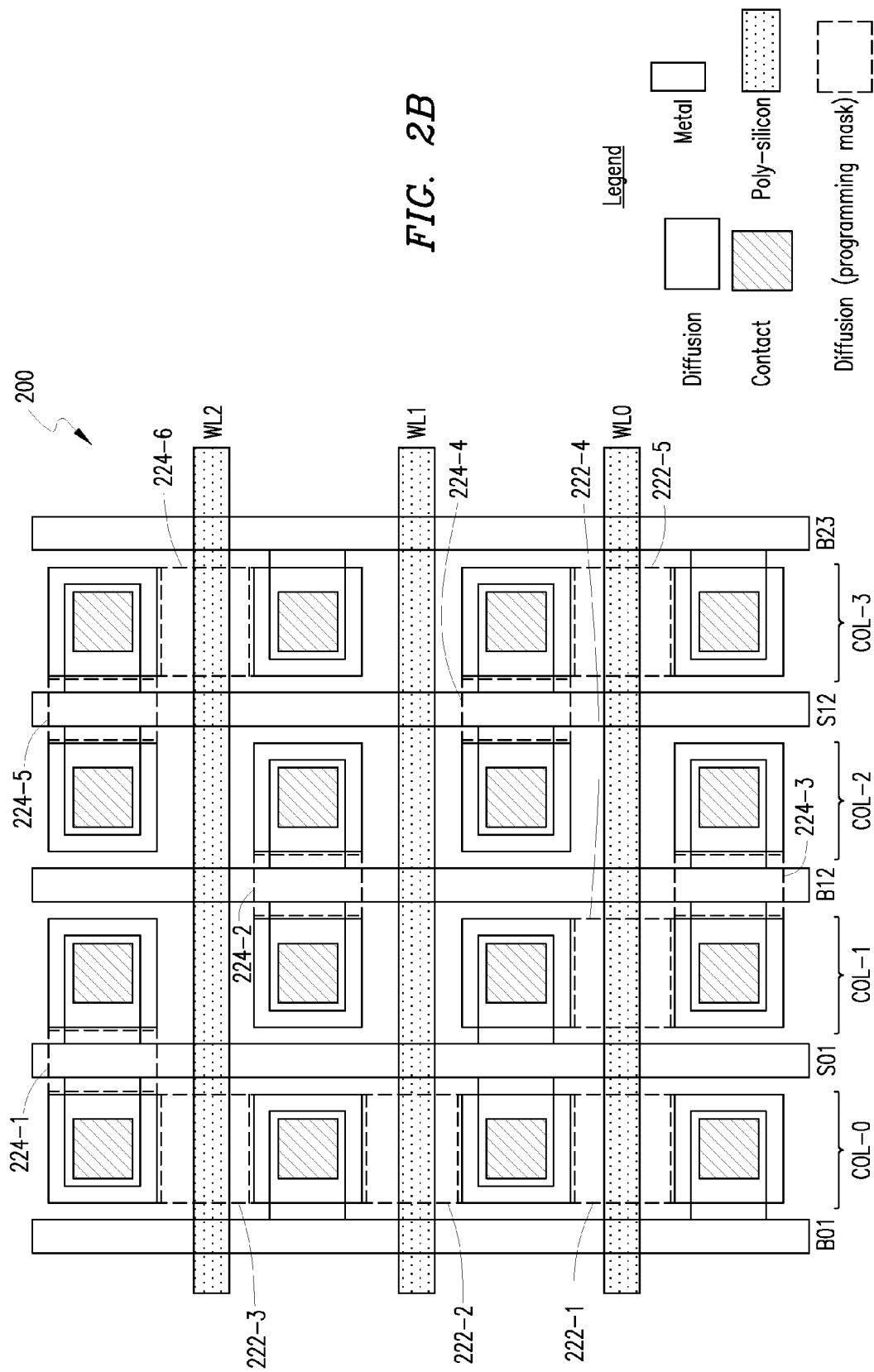
FIG. 2B depicts an exemplary programmed state of the ROM array of FIG. 2A in accordance with the teachings of the present invention.

As before, the source and bit lines are maintained at a particular level, e.g., precharged to VDD. Programming is effectuated depending on placing or withholding the diffusion areas between the source and drain terminals at predetermined cell locations for storing a particular logic value, e.g., a binary 0 or a binary 1. FIG. 2B depicts an exemplary programmed state of the ROM array 200 of FIG. 2A in accordance with the teachings of the present invention. By way of illustration, the following programming pattern is implemented:

TABLE 1

|  | COL-0 | COL-1 | COL-2 | COL-3 |
| --- | --- | --- | --- | --- |
| ROW-0 | 0 | 0 | 1 | 0 |
| ROW-1 | 0 | 1 | 1 | 1 |
| ROW-2 | 0 | 1 | 1 | 0 |

Accordingly, six programming diffusion areas are placed at cell locations 202-(0,0); 202-(1,0); 202-(2,0); 202-(0,1); 202-(0,3); and 202-(2,3). In FIG. 2B, reference numerals 222-1 through 222-6 refer to these areas that are shown as rectangles with broken lines in bold. The other cell locations are to store a binary 1 and, accordingly, they do not receive a programming diffusion thereat. That is, in essence, no functional transistors are formed at these locations having a binary 1. Depending on how these "logic 1 cells" are disposed in the array, especially with respect to other logic 1 cells on the same columns, an additional diffusion, referred to herein as "diffusion extension," is provided at the source and drain terminals of the logic 1 cells in order to meet the minimum area rules since the size of the source/drain diffusion islands in the array is reduced to achieve compactness. Where a logic 1 cell is disposed next to another logic 1 cell on the same column, i.e., a first logic 1 cell may be above or below the other logic 1 cell, the drain diffusion islands of the logic 1 cells are provided with a diffusion extension each that operates to electrically couple each drain terminal to the drain terminal of an adjacent cell on the same row, whereby the minimum area requirements with respect to the drain diffusion layer are met. Likewise, the source diffusion islands of such logic 1 cells are also provided a diffusion extension each that operates to electrically couple each source terminal to the source terminal of an adjacent cell on the same row, in order to meet the minimum area requirements with respect to the source diffusion layer. Consider the storage location at the intersection of ROW-2 and COL-1, i.e., cell 202-(2,1), which does not have a programming diffusion area; hence it is a logic 1 cell. The location below it, i.e., cell 202-(1,1) at the intersection of ROW-1 and COL-1, is also a logic 1 cell. Accordingly, a source diffusion extension 224-1 is provided between the source terminal of cell 202-(2,1) and the source terminal of its adjacent cell 202-(2,0) disposed on the same row with which it shares the common source line S01 208-(0,1). In similar fashion, a drain diffusion extension 224-2 is provided between the drain terminal of cell 202-(2,1) and the drain terminal of the adjacent cell 202-(1,2) with which it shares a common bit line B12 206-(1,2). Likewise, other diffusion extensions are appropriately provided in the array 200 where the placement of the logic 1 cells follows the topological requirement that two logic 1 cells are next to each other on the same column. In FIG. 2B, reference numerals 224-3 through 224-5 refer to the additional diffusion extensions required based on the illustrative programming pattern provided in Table 1.

On the other hand, where a logic 1 cell is disposed between two logic 0 cells on the same column, no diffusion extensions are provided with respect to the source and drain terminals of such logic 1 cells. This is based on the observation that source and drain islands of such cells are already coupled to the programming diffusion areas of the logic 0 cells above and below them, thereby satisfying the minimum area requirements. Accordingly, it should be appreciated that based on a particular programming pattern in an array, a diffusion island is in electrical contact with a diffusion extension, a programming diffusion area, or both, thus meeting the requisite design rules while maintaining a reduced cell size. Electrical characteristics of the array are not altered, however, because where the diffusion extensions are provided, the source and/or bit lines are already in electrical contact due to the shared column architecture. In addition, because of the virtual ground arrangement, reduction in leakage power continues to be available.

Figure 3:
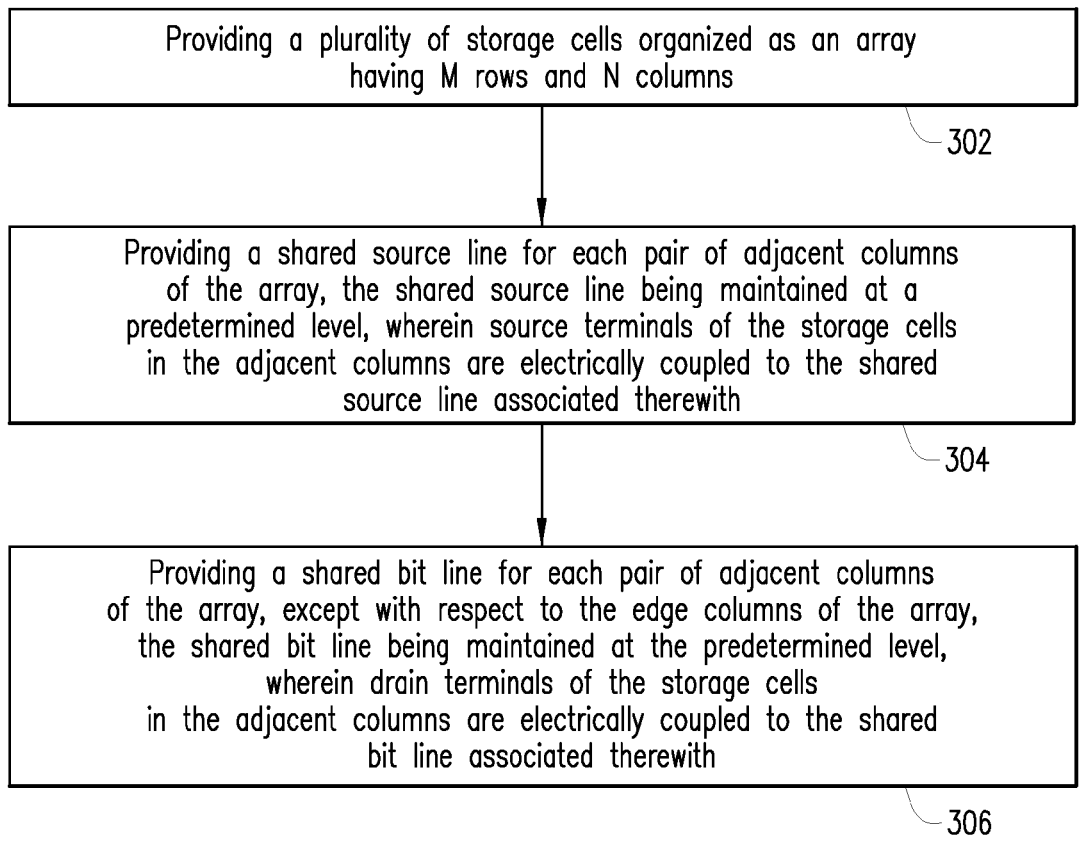

FIGS. 3 and 4 depict flowcharts of a design and programming methodology of the shared source line and bit line architecture for diffusion programmable ROM in accordance with one embodiment of the present invention. At block 302, a plurality of ROM storage cells are provided in an array having M rows and N columns, which array may be a standalone circuit or an instance in a compilable device. A shared source line is provided for each pair of adjacent columns of the array, wherein source terminals of the storage cells in the adjacent columns are electrically coupled to the shared source line associated therewith (block 304). A shared bit line is provided for each pair of adjacent columns of the array, except with respect to the edge columns of the array in certain embodiments as alluded to hereinabove, wherein drain terminals of the storage cells in the adjacent columns are electrically coupled to the shared bit line associated therewith (block 306). Typically, the source and bit lines are maintained at the same voltage level, e.g., precharged to VDD.

Referring in particular to FIG. 4, with respect to programming, a diffusion area is provided between the source and drain diffusion islands (i.e., terminals) of each predetermined ROM storage cell location for programming a first logic value (i.e., a binary 0) (block 402). For programming a second logic value, i.e., a binary 1, in predetermined ROM storage locations, the diffusion area is not provided (i.e, it is withheld) between the source and drain diffusion islands of the cells (block 404). A compensatory diffusion area, i.e., diffusion extension, is provided for cell locations having the second logic value such that the diffusion extension is operable to electrically couple two adjacent source diffusion islands (sharing a common source line), two adjacent drain diffusion islands (sharing a common bit line), or both, depending on the positional pattern of the logic values (block 406).

Based on the foregoing, it should be appreciated that the embodiments of the present invention provide an efficient and elegant architectural scheme whereby both cell size and reduced leakage objectives may be met in the design of a ROM. As a further variation, the teachings herein may be practiced in a partitioned source line arrangement, wherein decoded source lines are partitioned into a plurality of segments such that each SL segment may be coupled to only a bank of rows instead of M rows (i.e., the entire height of an array. Furthermore, one of ordinary skill in the art should recognize that the teachings of the present invention may be practiced in standalone diffusion programmable ROM devices as well as compilable ROM applications having one or more ROM instances that are generated using appropriate memory compilers as set forth hereinabove.

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed is:

1. A method of programming a Read-Only Memory (ROM) circuit having a plurality of storage cells organized as an array of rows and columns, said method comprising:
for a first subset of storage cells, providing a diffusion area between source and drain terminals of each predetermined storage cell of said first subset for programming a first logic value thereat;
for a second subset of storage cells, withholding said diffusion area between source and drain terminals of each predetermined storage cell of said second subset for programming a second logic value thereat; and
providing at least one of a source diffusion extension and a drain diffusion extension for said source and drain terminals respectively, of a particular storage cell of said second subset that is disposed on a particular column, if said particular storage cell having said second logic value is located next to another storage cell on said particular column having said second logic value.

2. The method of programming a ROM circuit as set forth in claim 1, wherein said first logic value comprises a binary 0.

3. The method of programming a ROM circuit as set forth in claim 1, wherein said second logic value comprises a binary 1.

4. The method of programming a ROM circuit as set forth in claim 1, wherein said source diffusion extension of said particular storage cell is extended over a shared source line associated with said particular storage cell.

5. The method of programming a ROM circuit as set forth in claim 1, wherein said drain diffusion extension of said particular storage cell is extended over a shared bit line associated with said particular storage cell.

6. A Read-Only Memory (ROM) circuit produced by the method as set forth in claim 1.

7. A system for programming a Read-Only Memory (ROM) circuit having a plurality of storage cells organized as an array of rows and columns, said system comprising:
means for providing a diffusion area between source and drain terminals of each predetermined storage cell of a first subset of storage cells, thereby programming a first logic value thereat;
means for withholding said diffusion area between source and drain terminals of each predetermined storage cell of a second subset of storage cells, thereby programming a second logic value thereat; and
means for providing at least one of a source diffusion extension and a drain diffusion extension for said source and drain terminals, respectively, of a particular storage cell of said second subset that is disposed on a particular column, if said particular storage cell having said second logic value is located next to another storage cell on said particular column having said second logic value.

8. The system for programming a ROM circuit as set forth in claim 7, wherein said first logic value comprises a binary 0.

9. The system for programming a ROM circuit as set forth in claim 7, wherein said second logic value comprises a binary 1.

10. The system for programming a ROM circuit as set forth in claim 7, wherein said source diffusion extension of said particular storage cell is extended over a shared source line associated with said particular storage cell.

11. The system for programming a ROM circuit as set forth in claim 7, wherein said drain diffusion extension of said particular storage cell is extended over a shared bit line associated with said particular storage cell.

* * * * *